United States Patent
Werner et al.

(10) Patent No.: US 10,886,431 B2
(45) Date of Patent: Jan. 5, 2021

(54) OPTOELECTRONIC SEMICONDUCTOR CHIP AND METHOD FOR PRODUCING AN OPTOELECTRONIC SEMICONDUCTOR CHIP

(71) Applicant: OSRAM Opto Semiconductors GmbH, Regensburg (DE)

(72) Inventors: Katharina Werner, Regensburg (DE); Andreas Rudolph, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/182,382

(22) Filed: Nov. 6, 2018

(65) Prior Publication Data
US 2019/0140139 A1 May 9, 2019

(30) Foreign Application Priority Data
Nov. 6, 2017 (DE) .................. 10 2017 125 821

(51) Int. Cl.
| H01L 31/0336 | (2006.01) |
| H01L 33/12 | (2010.01) |
| H01L 33/22 | (2010.01) |
| H01L 33/02 | (2010.01) |
| H01L 33/00 | (2010.01) |
| H01L 33/06 | (2010.01) |
| H01S 5/30 | (2006.01) |
| H01S 5/343 | (2006.01) |
| H01L 33/30 | (2010.01) |

(52) U.S. Cl.
CPC .......... *H01L 33/12* (2013.01); *H01L 33/0062* (2013.01); *H01L 33/02* (2013.01); *H01L 33/025* (2013.01); *H01L 33/06* (2013.01); *H01L 33/22* (2013.01); *H01S 5/3054* (2013.01); *H01S 5/34346* (2013.01); *H01L 33/30* (2013.01)

(58) Field of Classification Search
CPC ..... H01L 33/02; H01L 33/0062; H01L 33/00; H01L 33/12
See application file for complete search history.

(56) References Cited

U.S. PATENT DOCUMENTS

| 5,040,186 A | 8/1991 | Logan et al. |
| 2013/0032781 A1 | 2/2013 | Miyoshi et al. |
| 2013/0056745 A1 | 3/2013 | Chen |
| 2015/0179884 A1* | 6/2015 | Kang ............... H01L 33/20 257/98 |

* cited by examiner

*Primary Examiner* — Samuel A Gebremariam
(74) *Attorney, Agent, or Firm* — Slater Matsil, LLP

(57) ABSTRACT

An optoelectronic semiconductor chip and a method for producing an optoelectronic semiconductor chip are disclosed. In an embodiment an optoelectronic semiconductor chip includes a p-doped region, an active region configured to emit electromagnetic radiation during operation of the optoelectronic semiconductor chip, an n-doped region, a cover layer and a barrier region. The active region is arranged between the p-doped region and the n-doped region in a vertical direction, wherein the active region is based on a III-V semiconductor compound and the barrier region includes gallium, wherein the barrier region is configured to inhibit penetration of defects into the active region, and wherein the cover layer is arranged on the barrier region, the cover layer having a structured surface.

18 Claims, 2 Drawing Sheets

OPTOELECTRONIC SEMICONDUCTOR CHIP AND METHOD FOR PRODUCING AN OPTOELECTRONIC SEMICONDUCTOR CHIP

CROSS-REFERENCE TO RELATED APPLICATIONS

This application claims the benefit of German patent application 102017125821.3, filed Nov. 6, 2017, which application is hereby incorporated herein by reference.

TECHNICAL FIELD

An optoelectronic semiconductor chip and a method for producing an optoelectronic semiconductor chip are provided.

SUMMARY OF THE INVENTION

Embodiments provide an optoelectronic semiconductor chip which can be operated efficiently. Further embodiments provide a method for producing an optoelectronic semiconductor chip, which can be operated efficiently.

According to at least one embodiment of the optoelectronic semiconductor chip, the optoelectronic semiconductor chip comprises a p-doped region. The p-doped region is doped with at least one p-type dopant. The p-doped region can comprise one or more p-doped semiconductor layers.

The optoelectronic semiconductor chip can further comprise a semiconductor body which comprises the p-doped region. The semiconductor body can comprise a main plane of extension. The semiconductor body can be a three-dimensional body which has, for example, the shape of a cuboid or a cylinder. The main plane of extension of the semiconductor body runs parallel to one of the cover surfaces of the cuboid or of the cylinder. The semiconductor body can be formed with a semiconductor material, such as, for example, a III-V compound semiconductor material. Furthermore, the p-doped region can extend over the entire lateral extent of the semiconductor body. The lateral extent of the semiconductor body is parallel to the main plane of extension of the semiconductor body.

According to at least one embodiment of the optoelectronic semiconductor chip, the optoelectronic semiconductor chip comprises an active region, which is arranged to emit electromagnetic radiation during operation of the optoelectronic semiconductor chip and which has a main plane of extension. The semiconductor body can comprise the active region. The main plane of extension of the active region can run parallel to the main plane of extension of the semiconductor body. The semiconductor chip is, for example, a luminescence diode chip such as a light-emitting diode chip or a laser diode chip. The active region can thus be arranged to emit light during operation. The active region can comprise at least one quantum well structure.

According to at least one embodiment of the optoelectronic semiconductor chip, the optoelectronic semiconductor chip comprises an n-doped region. The n-doped region is doped with at least one n-dopant. The n-doped region can comprise one or more n-doped semiconductor layers. The semiconductor body can comprise the n-doped region. Furthermore, the n-doped region can extend over the entire lateral extent of the semiconductor body.

According to at least one embodiment of the optoelectronic semiconductor chip, the optoelectronic semiconductor chip comprises a barrier region. The barrier region can extend over the entire lateral extent of the semiconductor body. The semiconductor body can comprise the barrier region. It is also possible for the barrier region to be arranged adjacent to the semiconductor body. For example, the barrier region can be arranged above or below the semiconductor body in a vertical direction, which is perpendicular to the main plane of extension of the active region. Furthermore, the n-doped region can comprise the barrier region. That is to say that the barrier region can be arranged in the n-doped region. Alternatively, the p-doped region can comprise the barrier region. That is to say that the barrier region can be arranged in the p-doped region. The barrier region can be formed with at least one semiconductor material.

The semiconductor body, which can comprise the p-doped region, the active region, the n-doped region and the barrier region can be based on a III-V semiconductor compound.

According to at least one embodiment of the optoelectronic semiconductor chip, the active region is arranged between the p-doped region and the n-doped region in a vertical direction. In this case, the p-doped region, the active region and the n-doped region can have the same or a similar lateral extent. The optoelectronic semiconductor chip can comprise a radiation exit side, at which the electromagnetic radiation emitted by the active region during operation can leave the optoelectronic semiconductor chip. The radiation exit side can be arranged, for example, on a side of the n-doped region facing away from the active region. It is also possible for the radiation exit side to be arranged on a side of the p-doped region facing away from the active region.

According to at least one embodiment of the optoelectronic semiconductor chip, the active region is based on a III-V semiconductor compound. This means that the active region can be formed with III-V semiconductor materials or semiconductor compounds. It is also possible for the active region to comprise III-V semiconductor materials or semiconductor compounds at least in places.

According to at least one embodiment of the optoelectronic semiconductor chip, the barrier region extends parallel to the active region. This means that the barrier region can have a main plane of extension which is parallel to the main plane of extension of the active region. The barrier region can in particular have a uniform thickness in the vertical direction.

According to at least one embodiment of the optoelectronic semiconductor chip, the barrier region comprises gallium. Thus, the barrier region comprises gallium at least in places. The barrier region can have a uniform gallium concentration or distribution. Alternatively, the barrier region can have an irregular gallium concentration or distribution. The barrier region can additionally comprise further materials, for example, further semiconductor materials.

The amount of gallium in the barrier region can be specified by the product of the thickness of the barrier region in the vertical direction and the gallium concentration in the barrier region. The thickness of the barrier region in the vertical direction is given by the extent of the barrier region in the vertical direction. The product of the thickness of the barrier region in the vertical direction and the gallium concentration in the barrier region can be, for example, at least 0.5, wherein the thickness of the barrier region is given in μm and the gallium concentration in percent. This means that at a gallium concentration of, for example, 20%, 20% of the atoms in the barrier region are gallium. It is also possible that the product of the thickness of the barrier region in vertical direction and the gallium concentration in the barrier region is at least 1.5.

According to at least one embodiment of the optoelectronic semiconductor chip, the barrier region is arranged to inhibit the penetration of defects into the active region. For this purpose, the barrier region can be arranged between the active region and a further region of the semiconductor chip, from which defects can penetrate into adjoining regions. In this case, the barrier region can act as a barrier for the defects from the further region. By arranging the barrier region in the optoelectronic semiconductor chip, the number of defects in the active region can be reduced. This means that, by arranging the barrier region in the optoelectronic semiconductor chip, the number of defects, which penetrate into the active region, is reduced in comparison to an otherwise structurally identical semiconductor chip without a barrier region.

According to at least one embodiment of the optoelectronic semiconductor chip, the optoelectronic semiconductor chip comprises a p-doped region, an active region, which is arranged to emit electromagnetic radiation during operation of the optoelectronic semiconductor chip and which has a main plane of extension, an n-doped region, and a barrier region. The active region is arranged between the p-doped region and the n-doped region in a vertical direction, wherein the vertical direction runs perpendicular to the main plane of extension of the active region, and the active region is based on a III-V semiconductor compound. The barrier region extends parallel to the active region and comprises gallium, and is arranged to inhibit the penetration of defects into the active region.

The optoelectronic semiconductor chip described here is based, inter alia, on the idea, by arranging the barrier region in the optoelectronic semiconductor chip, the penetration of defects into the active region can be reduced. Defects can form in different regions of the optoelectronic semiconductor chip. For example, defects can form on a surface of the optoelectronic semiconductor chip, where the surface is processed or patterned. By roughening a surface, for example, defects can be produced in the optoelectronic semiconductor chip. The defects can be, for example, lattice defects, vacancies or impurities. The defects can subsequently diffuse at an elevated temperature or during operation of the optoelectronic semiconductor chip and penetrate into the active region. Defects in the active region can lead to a reduction in the intensity of the electromagnetic radiation emitted by the active region during operation. The brightness of the electromagnetic radiation emitted by the optoelectronic semiconductor chip during operation can thus be reduced by the penetration of the defects into the active region. In addition, the brightness of the electromagnetic radiation emitted by the optoelectronic semiconductor chip during operation can decrease in the course of the operation of the optoelectronic semiconductor chip, for example, because of the influence of electromagnetic radiation impinging on the optoelectronic semiconductor chip.

The barrier region is arranged in such a way that the penetration of defects into the active region is inhibited. It has been found that a barrier region, which comprises gallium, can act as a barrier for the penetration of defects into the active region. The barrier region can thus reduce the diffusion of defects into the active region. The barrier region can act as a defect diffusion barrier. Surprisingly, it has been found that the effect as a barrier is a function of the amount of gallium. This means that the amount of gallium is decisive for the effect as a barrier, and the thickness in vertical direction of the barrier region or the gallium concentration in the barrier region are not decisive for the effect as a barrier.

Since fewer defects can penetrate into the active region by arranging the barrier region, the attenuation of the intensity of the electromagnetic radiation emitted by the active region during operation is reduced. The optoelectronic semiconductor chip can thus emit electromagnetic radiation having a greater intensity or brightness during an operating period. This means that the light aging can be reduced over a longer period of time. The brightness of the electromagnetic radiation emitted by the optoelectronic semiconductor chip during operation can decrease to a lesser extent over a specific time period. The optoelectronic semiconductor chip can thus be operated more efficiently.

According to at least one embodiment of the optoelectronic semiconductor chip, the optoelectronic semiconductor chip comprises a structured surface, wherein the barrier region is arranged between the active region and the structured surface in the vertical direction. The structured surface can be a surface on an outer side of the optoelectronic semiconductor chip. For example, the structured surface can be arranged at the radiation exit side of the optoelectronic semiconductor chip. Furthermore, it is possible for the structured surface to be arranged at a side facing away from the radiation exit side.

The structured surface can be structured during the production process of the optoelectronic semiconductor chip. For example, the structured surface can be structured by etching, by dry-chemical processes, by mechanical processes or by plasma treatment. The structured surface can be a roughened surface. Furthermore, the structured surface can have an irregular or a regular surface topography. In particular, the structured surface is not a smooth surface. In addition, the structured surface can be a damaged surface. This means that the surface can be damaged during the production process of the optoelectronic semiconductor chip. In this case, for example, the structure or the topography of the surface can be changed. For example, the surface can be damaged by roughening.

The barrier region is arranged between the active region and the structured surface in the vertical direction, in order to reduce the penetration of defects into the active region from the region of the structured surface. In this case, the barrier region acts as a diffusion barrier for defects. This prevents the brightness of the electromagnetic radiation emitted by the optoelectronic semiconductor chip during operation being reduced by defects in the active region. The optoelectronic semiconductor chip can therefore be operated more efficiently.

According to at least one embodiment of the optoelectronic semiconductor chip, the barrier region comprises aluminum at least in places. The barrier region can thus be based on a III-V semiconductor compound with gallium and aluminum. In addition, the barrier region can comprise arsenic and/or phosphor. These materials are particularly suitable for encapsulation layers for optoelectronic semiconductor chips. Thus, the barrier region can be arranged, for example, within an encapsulation layer. The encapsulation layer can protect the optoelectronic semiconductor chip against moisture, for example.

According to at least one embodiment of the optoelectronic semiconductor chip, the barrier region comprises AlGaIn at least in places. In addition, the barrier region can comprise arsenic and/or phosphor. These materials are particularly suitable for encapsulation layers for optoelectronic semiconductor chips.

According to at least one embodiment of the optoelectronic semiconductor chip, the barrier region comprises a layer sequence, which comprises pairs of alternating layers, wherein each pair comprises a first layer and a second layer. This means that the layer sequence comprises alternating first and second layers. In this case, the first layers and the second layers are arranged one above the other in the vertical direction. Each of the first layers and each of the second layers can extend over the entire lateral extent of the barrier region. At least one first layer can directly adjoin a second layer at a first side and the at least one first layer can directly adjoin a further second layer at a second side, which faces away from the first side. In addition, at least one second layer can directly adjoin a first layer at a first side and the at least one second layer can directly adjoin a further first layer at a second side, which faces away from the first side.

At least one of the first layer and the second layer comprises gallium. The layer sequence can thus act as a barrier for a diffusion of defects into the active region.

According to at least one embodiment of the optoelectronic semiconductor chip, the first layer and the second layer of each pair differ in their gallium concentration. For example, all of the first layers can have a first gallium concentration which differs from a second gallium concentration of the second layers. In addition, the ratio between gallium and aluminum in the first layers can differ from the ratio between gallium and aluminum in the second layers. For example, each of the first layers can have a first ratio between aluminum and gallium, which differs from a second ratio between aluminum and gallium of the second layers. The first layers thus differ in terms of their composition from the second layers. It has been found that a barrier region comprising a layer sequence, in which the first layer and the second layer of each pair differ in their gallium concentration, represents a particularly effective barrier against the diffusion of defects into the active region.

According to at least one embodiment of the optoelectronic semiconductor chip, the first layer and the second layer comprise gallium. In addition, the first layer and the second layer can differ in their gallium concentration. As the barrier region comprises gallium, the latter acts as a barrier for the diffusion of defects into the active region.

According to at least one embodiment of the optoelectronic semiconductor chip, either the first layer or the second layer is nominally free of gallium. In this case, the layers which comprise gallium can each have the same gallium concentration. The fact that a layer is nominally free of gallium can mean that no gallium is deposited for the growth of the respective layer. However, it is possible for gallium to diffuse from adjacent layers into this layer. In the layer which is nominally free of gallium, a gallium profile can arise in the vertical direction, in which the gallium concentration initially decreases, has a local minimum and subsequently increases again. As the barrier region comprises gallium either in the first layer or in the second layer, the latter acts as a barrier for the diffusion of defects into the active region.

According to at least one embodiment of the optoelectronic semiconductor chip, one layer of each pair is compressively stressed and the respective other layer of each pair is tensioned. The layers of each pair can in each case be compressively stressed or tensioned because they differ in terms of their material composition. The first layers and the second layers can each have a thickness of, for example, at least 1 nm and at most 100 nm. The growth of layers of different material composition can therefore lead to in each case one layer of each pair being compressively stressed and the respective other layer of each pair being tensioned. The fact that the layers are compressively stressed or tensioned can be detected, for example, by transmission electron microscopy.

It has been found that for a layer sequence, in which one layer of each pair is compressively stressed and the respective other layer of each pair is tensioned, overall, a smaller quantity of gallium is required, in order to achieve improved brightness of the electromagnetic radiation emitted by the optoelectronic semiconductor chip during operation after a specific operating time than for a layer sequence, in which the layers are not stressed. Since, for example, in the AlGaAsP material system, the absorption of the electromagnetic radiation emitted by the active region is increased due to a larger quantity of gallium is present in the barrier region, it is advantageous, if already for a smaller amount of gallium an improved brightness of the electromagnetic radiation emitted by the optoelectronic semiconductor chip during operation can be achieved after a specific operating time. The smaller the amount of gallium in the barrier region, the lower is the absorption in the barrier region of electromagnetic radiation generated in the active region. The brightness of the electromagnetic radiation emitted by the optoelectronic semiconductor chip after a specific operating duration can thus be increased by a small amount of gallium in the barrier region.

Furthermore, for a barrier region comprising a layer sequence, in which in each case one layer of each pair is compressively stressed and the respective other layer of each pair is tensioned, overall, a smaller amount of gallium can be required to improve the brightness than for a barrier region which comprises no layer sequence.

According to at least one embodiment of the optoelectronic semiconductor chip, the first layer and the second layer of each pair differ in their indium concentration. For example, the indium concentration of the first layers can differ by at least 0.2% and at most 10% from the indium concentration of the second layers. Due to the difference in the indium concentration between the first layer and the second layer, in each case one layer of each pair can be compressively stressed and the respective other layer can be tensioned. In addition, the ratio between aluminum and gallium in the first layer can differ from the ratio between aluminum and gallium in the second layer. Thus, the first layer of each pair overall has a different material composition than the second layer of each pair. In this case, a strain in the layers, such that in each case one layer of each pair is compressively stressed and the respective other layer of each pair is tensioned, can be achieved by means of different material combinations.

In each case one layer of each pair can be formed with AlGaInP, for example, and the respective other layer of each pair can be formed with AlInP. Furthermore, the layer sequence can comprise at least two pairs of alternating layers and at most 100 pairs of alternating layers.

Embodiments of the invention further relate to a method for producing an optoelectronic semiconductor chip. The optoelectronic semiconductor chip can preferably be produced by a method described here. In other words, all the features disclosed for the optoelectronic semiconductor chip are also disclosed for the method for producing an optoelectronic semiconductor chip, and vice versa.

According to at least one embodiment of the method for producing an optoelectronic semiconductor chip, the method comprises a method step, in which a p-doped region is provided. The p-doped region can, for example, be grown on a growth substrate.

According to at least one embodiment of the method, the method comprises a method step in which an active region is provided, which is arranged to emit electromagnetic radiation during operation of the optoelectronic semiconductor chip and which has a main plane of extension. The active region can be arranged on the p-doped region.

According to at least one embodiment of the method, the method comprises a method step in which an n-doped region is provided. The n-doped region can be grown on the active region. It is also possible that the n-doped region is grown on a growth substrate, that the active region is arranged on the n-doped region and that the p-doped region is arranged on the active region. The optoelectronic semiconductor chip can be free of a growth substrate.

According to at least one embodiment of the method, the method comprises a method step in which gallium is deposited in a barrier region. This means, for example, that the product of the thickness of the barrier region in vertical direction and the gallium concentration in the barrier region is, for example, at least 0.5, wherein the thickness of the barrier region is given in µm. In this case, the barrier region can additionally comprise further materials. These can be deposited simultaneously with the gallium.

According to at least one embodiment of the method, the method comprises a method step in which a surface of the optoelectronic semiconductor chip is structured. The surface can be etched, for example. It is also possible for the surface to be treated with a plasma. If the surface is arranged at a radiation exit side of the optoelectronic semiconductor chip, a structuring of the surface can increase the coupling-out efficiency of the electromagnetic radiation emitted by the active region during operation. The surface can be damaged by the structuring. This means that, for example, the surface structure of the surface after structuring is different from the surface structure before the structuring. Damage to the surface can result in defects in the area of the surface.

According to at least one embodiment of the method, the active region is arranged between the p-doped region and the n-doped region in a vertical direction, wherein the vertical direction is perpendicular to the main plane of extension of the active region.

According to at least one embodiment of the method, the barrier region extends parallel to the active region. The barrier region can completely cover the active region.

According to at least one embodiment of the method, the barrier region is arranged between the active region and the surface which is structured in the vertical direction. The barrier region can thus inhibit the penetration of defects into the active region from the surface which is structured.

BRIEF DESCRIPTION OF THE DRAWINGS

The optoelectronic semiconductor chip described here and the method for producing an optoelectronic semiconductor chip described here are explained in more detail below in conjunction with exemplary embodiments and the associated figures.

Figure 1:
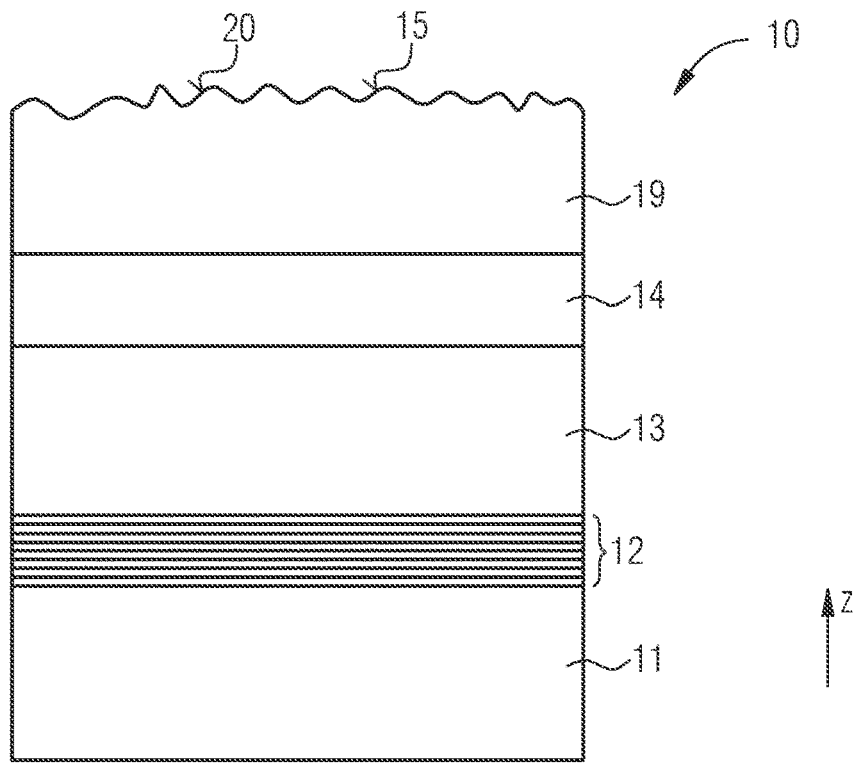
FIG. 1 shows a schematic cross section through an optoelectronic semiconductor chip according to an exemplary embodiment.

Identical, similar or identically acting elements are provided with the same reference numerals in the figures. The figures and the size ratios of the elements illustrated in the figures among one another are not to be regarded as being to scale. Rather, individual elements can be represented with an exaggerated size for better representability and/or for better intelligibility.

DETAILED DESCRIPTION OF ILLUSTRATIVE EMBODIMENTS

FIG. 1 shows a schematic cross section through an exemplary embodiment of an optoelectronic semiconductor chip 10. The optoelectronic semiconductor chip 10 comprises a p-doped region 11. An active region 12 is arranged on the p-doped region 11, wherein the active region 12 is arranged to emit electromagnetic radiation during operation of the optoelectronic semiconductor chip 10. The active region 12 is based on a III-V semiconductor compound and can comprise a quantum well structure. In addition, the active region has a main plane of extension. An n-doped region 13 is arranged on the active region 12. The active region is thus arranged between the p-doped region 11 and the n-doped region 13 in a vertical direction z, wherein the vertical direction z is perpendicular to the main plane of extension of the active region 12.

A barrier region 14 is arranged on the n-doped region 13. The barrier region 14 extends parallel to the active region 12, which means, for example, that a main plane of extension of the barrier region 14 is parallel to the main plane of extension of the active region 12. Furthermore, the barrier region 14 comprises gallium and is arranged to inhibit the penetration of defects into the active region 12.

A cover layer 19 is arranged on the barrier region 14. The cover layer 19 can be the topmost layer of the optoelectronic semiconductor chip 10. For example, the electromagnetic radiation emitted by the active region 12 during operation can leave the optoelectronic semiconductor chip 10 through the cover layer 19. In this case, a radiation exit side 20 of the optoelectronic semiconductor chip 10 is arranged at a side of the cover layer 19 facing away from the barrier region 14.

The cover layer 19 has a structured surface 15, which is arranged at the side of the cover layer 19 facing away from the barrier region 14. The structured surface 15 can be structured in such a way that it has a surface topography or a rough surface. The structured surface 15 can be structured during the production process of the optoelectronic semiconductor chip 10, for example, by etching or by plasma treatment. As a result, defects can arise in the cover layer 19 and on the surface 15. The barrier region 14 is arranged to inhibit the penetration of the defects into the active region 12 and the barrier region 14 is arranged between the active region 12 and the surface 15 in the vertical direction z. Since defects in the active region 12 can reduce the brightness of the electromagnetic radiation emitted by the optoelectronic semiconductor chip 10 during operation after a specific operating time, a reduction in the brightness of the electromagnetic radiation emitted by the optoelectronic semiconductor chip 10 during operation is advantageously prevented or reduced by the arrangement of the barrier region 14 between the surface 15 and the active region 12.

Figure 2:
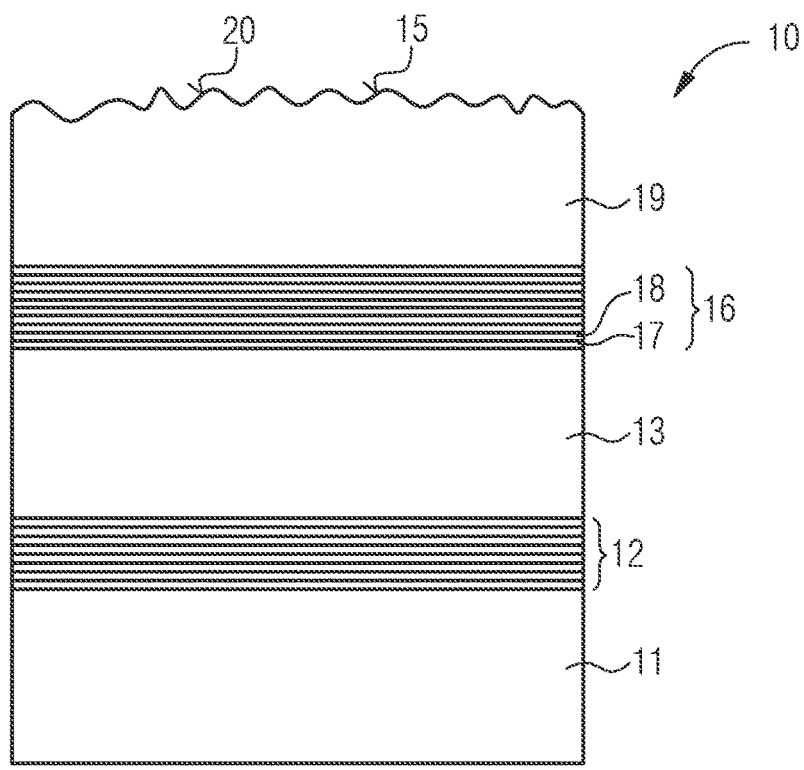
FIG. 2 shows a schematic cross section through an optoelectronic semiconductor chip according to a further exemplary embodiment; and In FIG. 3, the intensity of radiation emitted by various optoelectronic semiconductor chips is plotted.

FIG. 2 shows a schematic cross section through a further exemplary embodiment of an optoelectronic semiconductor chip 10. The setup in FIG. 2 differs from the exemplary embodiment shown in FIG. 1 only by the structure of the barrier region 14. In this exemplary embodiment, the barrier region 14 comprises a layer sequence 16. The layer sequence 16 comprises pairs of alternating layers, wherein each pair comprises a first layer 17 and a second layer 18. The first layer 17 and the second layer 18 of each pair can differ in terms of their material composition. In this case, each of the layers in the layer sequence 16 can comprise gallium or in each case one of the first layers 17 and of the second layers 18 can comprise gallium.

Figure 3:
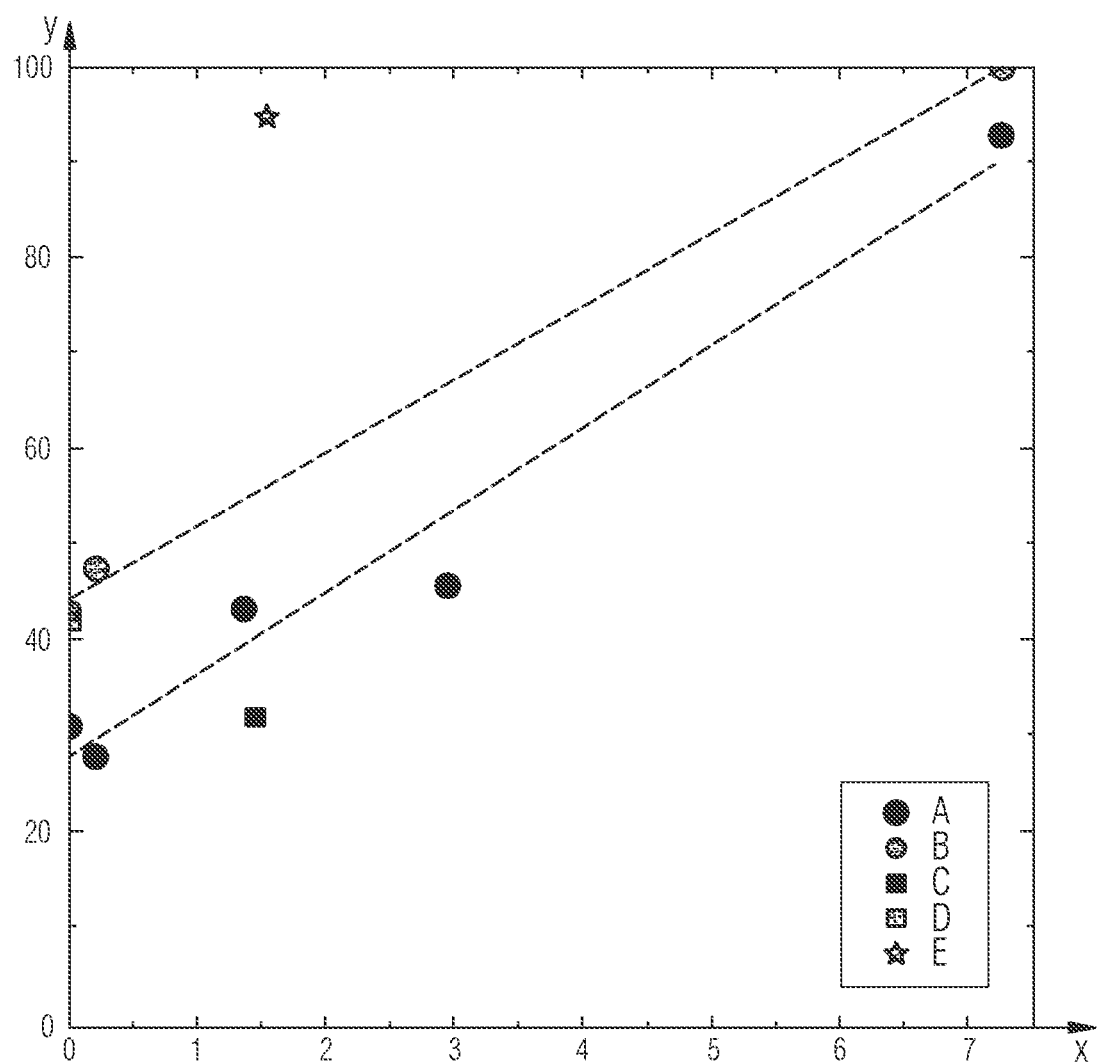

In FIG. 3, the intensity of radiation emitted by various optoelectronic semiconductor chips is plotted. The product of the layer thickness of the barrier region 14 in μm and the gallium proportion in the barrier region 14 in percent is plotted on the x-axis. The x-axis thus relates to the amount of gallium in the barrier region 14. On the y-axis, the intensity of the electromagnetic radiation emitted by the optoelectronic semiconductor chip 10 during operation after an operating duration of 170 hours is plotted in percent of the intensity of the electromagnetic radiation emitted by the optoelectronic semiconductor chip 10 during operation before the operating duration of the 170 hours, that is to say at an operating time of 0 hours. This means that the ratio between the intensity of the electromagnetic radiation emitted by the optoelectronic semiconductor chip 10 during operation after an operating time of 170 hours and the intensity during an initial operation at an operating time of 0 hours. The ratio of the intensities is plotted for various exemplary embodiments of the optoelectronic semiconductor chip 10. During the 170 hours operating time, the optoelectronic semiconductor chips 10 are also exposed to external electromagnetic radiation, which impinges on the optoelectronic semiconductor chip 10.

The exemplary embodiments A and B in FIG. 3 correspond to the exemplary embodiment shown in FIG. 1. In this case, the barrier region 14 comprises AlGaIn. The exemplary embodiments A and B have essentially the same structure and the same composition. At a value of less than 2 on the x-axis, the intensity of the electromagnetic radiation emitted by the optoelectronic semiconductor chip 10 after the operating time of 170 hours is greatly reduced compared to the initial intensity. With a rising value on the x-axis, the intensity is reduced to a lesser extent after 170 hours than in comparison to a smaller quantity of gallium in the barrier region 14. At a value of approximately 7 on the x-axis, the intensity of the electromagnetic radiation emitted by the optoelectronic semiconductor chip 10 after an operating time of 170 hours is between 90 and 99% of the initial intensity.

The exemplary embodiment C corresponds to the exemplary embodiment shown in FIG. 2, wherein the first layer 17 of each pair comprises AlInP and the second layer 18 of each pair comprises AlGaInP. In this exemplary embodiment, the first layers 17 and the second layers 18 are hardly or not at all stressed. The intensity of the electromagnetic radiation emitted by the optoelectronic semiconductor chip 10 according to the exemplary embodiment C after an operating time of 170 hours is similar to the exemplary embodiments A and B.

The example D in FIG. 3 corresponds to the structure shown in FIG. 2, wherein, however, the barrier region 14 does not comprise any gallium. In each case one layer of each pair of layer sequence 16 is compressively stressed and the respective other layer of each pair is tensioned. In this case, too, the intensity of the emitted electromagnetic radiation after an operating time of 170 hours is greatly reduced compared to an initial intensity.

The exemplary embodiment E corresponds to the exemplary embodiment shown in FIG. 2, wherein the first layer 17 comprises AlInP and the second layer 18 comprises AlGaInP. In addition, in each case one layer of each pair of the layer sequence 16 is compressively stressed and the respective other layer of each pair is tensioned. Even at a value of about 1.5 on the x-axis, the intensity of the electromagnetic radiation emitted by the optoelectronic semiconductor chip 10 after an operating time of 170 hours is about 95% of the initial intensity. Thus, in this exemplary embodiment, a substantially lower quantity of gallium is required than for the exemplary embodiments A and B, in order to achieve a similar percentage intensity. In comparison to the exemplary embodiment E, however, the exemplary embodiments A and B can be produced more easily.

The invention is not restricted to the exemplary embodiments by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

What is claimed is:

1. An optoelectronic semiconductor chip comprising:
   a p-doped region;
   an active region configured to emit electromagnetic radiation during operation of the optoelectronic semiconductor chip, the active region having a main plane of extension;
   an n-doped region;
   a cover layer; and
   a barrier region,
   wherein the active region is arranged between the p-doped region and the n-doped region in a vertical direction, the vertical direction running perpendicular to the main plane of extension of the active region,
   wherein the active region is based on a III-V semiconductor compound,
   wherein the barrier region comprises gallium and extends parallel to the active region,
   wherein the barrier region comprises a layer sequence comprising pairs of alternating layers, each pair comprising a first layer and a second layer, wherein the first layer and the second layer of each pair differ in an gallium concentration, and/or wherein at least one layer of each pair is either compressively stressed or tensioned,
   wherein the barrier region is configured to inhibit penetration of defects into the active region, and
   wherein the cover layer is arranged on the barrier region, the cover layer having a structured surface arranged at a side of the cover layer facing away from the barrier region.

2. The optoelectronic semiconductor chip according to claim 1, wherein the barrier region is arranged between the active region and the structured surface of the cover layer in the vertical direction.

3. The optoelectronic semiconductor chip according to claim 1, wherein the barrier region comprises aluminum at least in places.

4. The optoelectronic semiconductor chip according to claim 1, wherein the barrier region comprises AlGaIn at least in places.

5. The optoelectronic semiconductor chip according to claim 1, wherein the first layer and the second layer comprise gallium.

6. The optoelectronic semiconductor chip according to claim 1, wherein either the first layer or the second layer is nominally free of gallium.

7. The optoelectronic semiconductor chip according to claim 1, wherein one layer of each pair is compressively stressed and the respective other layer of each pair is tensioned.

8. The optoelectronic semiconductor chip according to claim 1, wherein the first layer and the second layer of each pair differ in their an indium concentration.

9. An optoelectronic semiconductor chip comprising:
a p-doped region;
an active region configured to emit electromagnetic radiation during operation of the optoelectronic semiconductor chip, the active region having a main plane of extension;
an n-doped region; and
a barrier region,
wherein the active region is arranged between the p-doped region and the n-doped region in a vertical direction, the vertical direction running perpendicular to the main plane of extension of the active region,
wherein the active region is based on a III-V semiconductor compound,
wherein the barrier region comprises gallium and extends parallel to the active region,
wherein the barrier region is configured to inhibit penetration of defects into the active region,
wherein the barrier region comprises a layer sequence comprising pairs of alternating layers, each pair comprising a first layer and a second layer, wherein the first layer and the second layer of each pair differ in an gallium concentration, and/or wherein at least one layer of each pair is either compressively stressed or tensioned.

10. The optoelectronic semiconductor chip according to claim 1, wherein a thickness of the barrier region and a gallium concentration in the barrier region are selected such that a product of the thickness of the barrier region measured in µm and the gallium concentration in the barrier region in percent is at least 0.5.

11. The optoelectronic semiconductor chip according to claim 9, wherein a thickness of the barrier region and a gallium concentration in the barrier region are selected such that a product of the thickness of the barrier region measured in µm and the gallium concentration in the barrier region in percent is at least 0.5.

12. The optoelectronic semiconductor chip according to claim 9, wherein the first layer and the second layer comprise gallium.

13. The optoelectronic semiconductor chip according to claim 9, wherein either the first layer or the second layer is nominally free of gallium.

14. The optoelectronic semiconductor chip according to claim 9, wherein one layer of each pair is compressively stressed and the respective other layer of each pair is tensioned.

15. The optoelectronic semiconductor chip according to claim 9, wherein the first layer and the second layer of each pair differ in an indium concentration.

16. The optoelectronic semiconductor chip according to claim 9, wherein the optoelectronic semiconductor chip comprises a structured surface, and wherein the barrier region is arranged between the active region and the structured surface in the vertical direction.

17. The optoelectronic semiconductor chip according to claim 9, wherein the barrier region comprises aluminum at least in places.

18. The optoelectronic semiconductor chip according to claim 9, wherein the barrier region comprises AlGaIn at least in places.

* * * * *

UNITED STATES PATENT AND TRADEMARK OFFICE
CERTIFICATE OF CORRECTION

PATENT NO. : 10,886,431 B2
APPLICATION NO. : 16/182382
DATED : January 5, 2021
INVENTOR(S) : Katharina Werner Page 1 of 1

It is certified that error appears in the above-identified patent and that said Letters Patent is hereby corrected as shown below:

In the Claims

In Column 11, Line 7, Claim 8, delete "their".

Signed and Sealed this
Sixth Day of April, 2021

Drew Hirshfeld
*Performing the Functions and Duties of the
Under Secretary of Commerce for Intellectual Property and
Director of the United States Patent and Trademark Office*